United States Patent
Zhang

[11] Patent Number: 5,881,130
[45] Date of Patent: Mar. 9, 1999

[54] FAST AND NOISE-INSENSITIVE LOAD STATUS DETECTION

[75] Inventor: Yun Zhang, Wheeling, Ill.

[73] Assignee: Teradyne, Inc., Boston, Mass.

[21] Appl. No.: 929,842

[22] Filed: Sep. 15, 1997

[51] Int. Cl.⁶ .......................... H04M 1/24; G01R 27/08; G01R 31/08
[52] U.S. Cl. .................. 379/6; 379/24; 379/30; 324/713; 324/527
[58] Field of Search ................. 379/5, 6, 22, 24, 379/26, 27, 29, 30, 32; 324/713, 707, 615, 619, 525, 527; 371/20.3

[56] References Cited

U.S. PATENT DOCUMENTS

| | | | |
|---|---|---|---|
| 4,307,267 | 12/1981 | Peoples | 379/30 |
| 4,486,627 | 12/1984 | Beeman et al. | |
| 4,620,069 | 10/1986 | Godwin et al. | |
| 5,386,194 | 1/1995 | Moehlmann | 324/713 |
| 5,404,388 | 4/1995 | Eu | 379/24 |
| 5,465,287 | 11/1995 | Egozi | 379/6 |
| 5,625,667 | 4/1997 | Vogt, II et al. | 379/30 |
| 5,649,304 | 7/1997 | Cabot | 379/6 |

*Primary Examiner*—Paul Loomis
*Attorney, Agent, or Firm*—Edmund J. Walsh

[57] ABSTRACT

Method and apparatus for detecting whether load coils are attached to a telephone line. A stimulus waveform having multiple frequency components is applied to the line. The current and voltage at the near end of the line are coherently sampled and transformed to the frequency domain. The frequency spectra are used to compute auto and cross power spectra of the current and voltage. These power spectra are then used to compute the impedance on the line as well as a coherence function that indicates the extent to which the computed impedance was influenced by noise. If the coherence values indicate that the computed impedance is sufficiently reliable, load coils are detected by finding peaks in the magnitude of the impedance function or sign changes in the phase of the impedance function. Calibration, offset adjustments and ensemble smoothing are used to increase the accuracy of the results. The computation is fast because computing the spectra avoids the need for individual measurements at multiple frequencies. The computation is accurate because it is not sensitive to noise.

3 Claims, 4 Drawing Sheets

FAST AND NOISE-INSENSITIVE LOAD STATUS DETECTION

This invention relates generally to telephone networks and more particularly to the detection of load coils in telephone networks.

Public switched telephone networks were originally set up to carry only analog voice signals. Voice signals are analog signals with a relatively low frequency range, predominately below 10 KHz. Telephone service to provide just one channel of voice is sometimes called plain old telephone service (POTS).

The telephone network was often optimized for POTS signals. One way that the network was optimized was through the inclusion of load coils on telephone lines. The load coils improved the frequency response of the lines for analog signals.

More recently, the public switched telephone network is being called upon to carry many signals other than analog voice signals. Digital services, such as Integrated Services Digital Network (ISDN), Digital Subscriber Line (DSL), Asymmetric Digital Subscriber Line (ASDL) and High-bit Rate Digital Subscriber Line (HDSL) services are being offered by telephone companies. Where possible, telephone companies would like to use the POTS lines for these expanded services.

It is particularly important to be able to use the same lines in the portion of the telephone network known as the subscriber loop. Portions of the telephone network are switched, meaning that they can be used by different people at different times for making telephone calls. However, each user of telephone services, or subscriber, must have their own connection to the portion of the network that is shared by other users. This connection is called the subscriber loop. There are many subscriber loops and they are spread out over the entire area in which the telephone company provides service. It would therefore be very costly to replace all of the subscriber loops.

However, a problem arises in using POTS subscriber lines for advanced services. The advanced services generally operate at frequencies that are much higher than the POTS lines were optimized to carry. The load coils that were often placed on POTS lines are a particular problem. To convert a POTS line to use for advanced services, the load coils can be removed. However, there is a problem if locating which lines are free of load coils so that they can be used for advanced services. This process is known as "characterizing" the telephone lines. To be efficient, the characterization should be done from the point where subscriber lines come together and join the switched network. This point is often called the central office and measurements taken from that point are often called "near end" measurements.

One way that telephone lines have been characterized is with a time domain reflectometer, or TDR. The TDR sends a pulse down the phone line and measures reflections of that pulse that come back to the TDR. A load coil on a line will create a reflection that can be detected at the central office. However, the TDR can generally only detect one load coil on a line. If a service technician will be sent to remove the load coils on a line, it would be highly desirable to know in advance the number of load coils on the line that need to be removed.

A second way that telephone lines have been characterized is with a "frequency sweep" approach. Examples of this approach can be found in U.S. Pat. Nos. 4,486,627 to Beeman et al., 4,620,069 to Goodwin et al. and 5,404,388 to Eu. These techniques involve attaching a signal generator to the telephone line and successively applying signals of various frequencies. The current and voltage on the line are measured, and the admittance of the line is calculated. Changes in the magnitude or phase of the admittance indicate that a load coil is present on the line. Multiple load coils on a line create multiple changes, allowing multiple coils to be detected.

A drawback of this approach is that it is slow. Taking measurements at multiple frequencies requires extra time. A typical switch will have thousands of subscriber loop lines attached to it. If all of these lines are tested in a scan test, a difference of less than a second in the time it takes to run each test could literally add hours to the total time it takes to complete the test. Tying up equipment or service personnel for such a long period of time is very undesirable.

Additionally, the technique is sensitive to noise and can give a wrong answer. It would be highly undesirable for a telephone company to use a subscriber line for advanced services if it contained load coils, as the quality of the service would be very poor. It would also be undesirable for a telephone company to send a person to remove a load coil from a telephone line if there was in fact no load coil on the line.

Thus, there is a need for an improved way to accurately and rapidly detect whether and how many load coils are attached to a telephone line.

SUMMARY OF THE INVENTION

With the foregoing background in mind, it is an object of the invention to provide rapid and accurate detection of load coils on a telephone line.

It is also an object to provide a method for detection of multiple load coils on a telephone line.

The foregoing and other objects are achieved according to the technique of measuring the current and voltage at the near end of a telephone line. Frequency spectra derived from these measurements are used to compute the impedance of the line. Changes in impedance as a function of frequency are used to detect load coils.

In a preferred embodiment, the spectra represent power spectra. Also in a preferred embodiment the spectra are smooth spectra determined by taking an ensemble average.

In one embodiment, the coherence function is computed from the power spectra, giving an indication of the reliability of the results.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
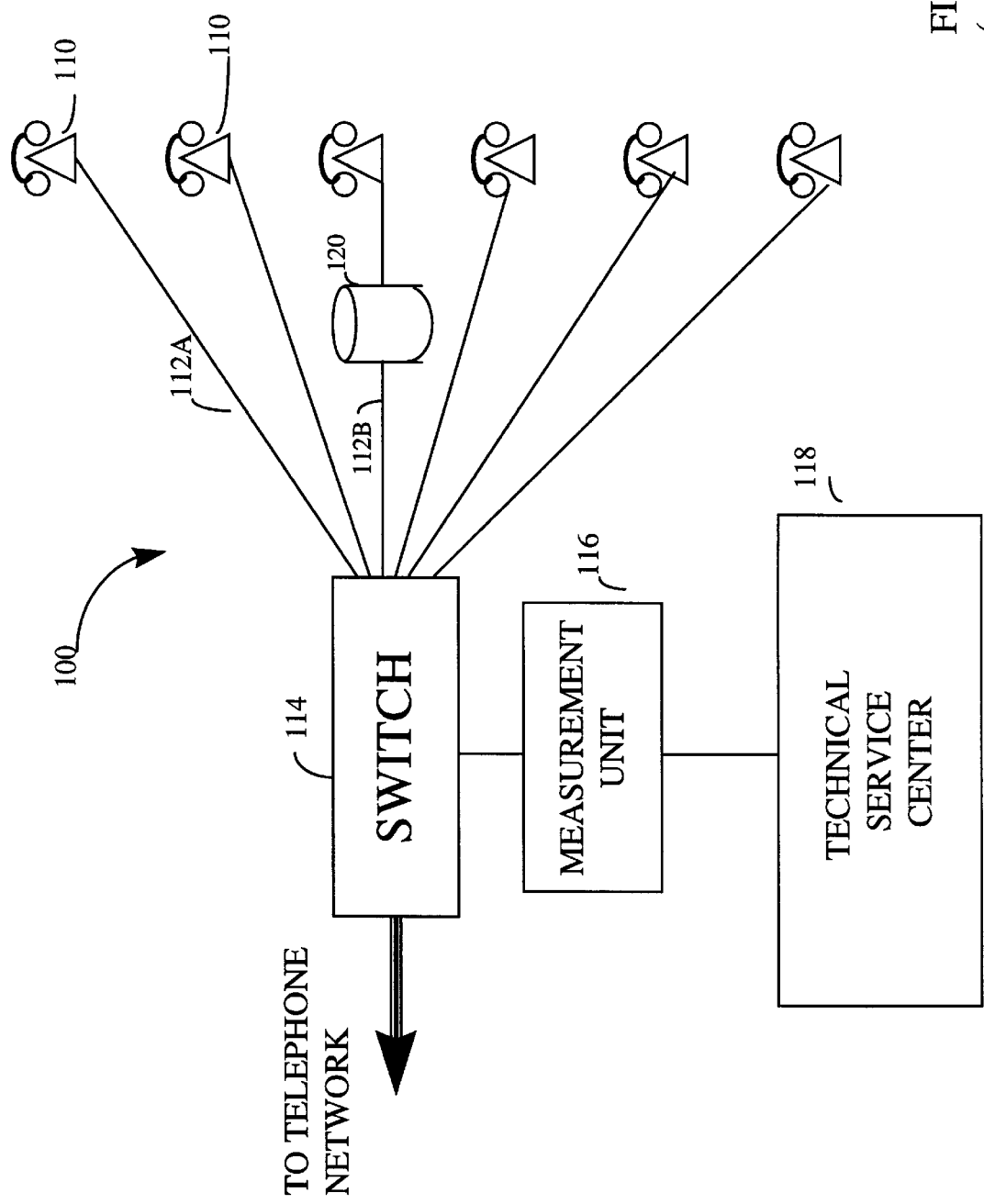
FIG. 1 is a sketch illustrating a portion of a prior art telephone network.

FIG. 1 shows a portion of a prior art switched telephone network. Switch 114 is connected over subscriber loop lines 112A and 112B to subscribers 110. Subscribers 110 might be using POTS service or might require advanced services such as ISDN. Subscriber line 112B contains load coil 120. Before subscriber line 1 12B can be used to provide advanced telephone services, load coil 120 would have to be removed. In contrast, subscriber loop lines 112A are free of load coils.

Switch 114 is connected to the remainder of the telephone network, such as trunk lines, more switches and many other subscriber loop lines. For clarity, the rest of the network is not shown.

Switch 114 is also connected to measurement unit 116. Measurement unit 116 is preferably a product, such as 4TEL sold by Teradyne of Deerfield, Ill., USA, though other measurement units are commercially available. Measurement unit 116 interfaces to switch 114 such that stimulus and measurement instruments inside measurement unit 116 can be connected to subscriber lines 112A and 112B through switch 114. Typically, measurement unit 116 will be located in the same building as switch 114 are directly wired to it.

Measurement unit 116 also interfaces to technical service center 118. Service and repair functions are usually performed from a technical service center 118. Numerous measurement units 116 throughout the network are all connected to technical service center 118. The connection is often made over a phone line or with some other form of link. Commands can be sent to measurement unit 116 from the technical service center that can initiate tests or measurements on subscriber lines 112A and 112B and the results can be sent back to technical service center 118.

Figure 2:
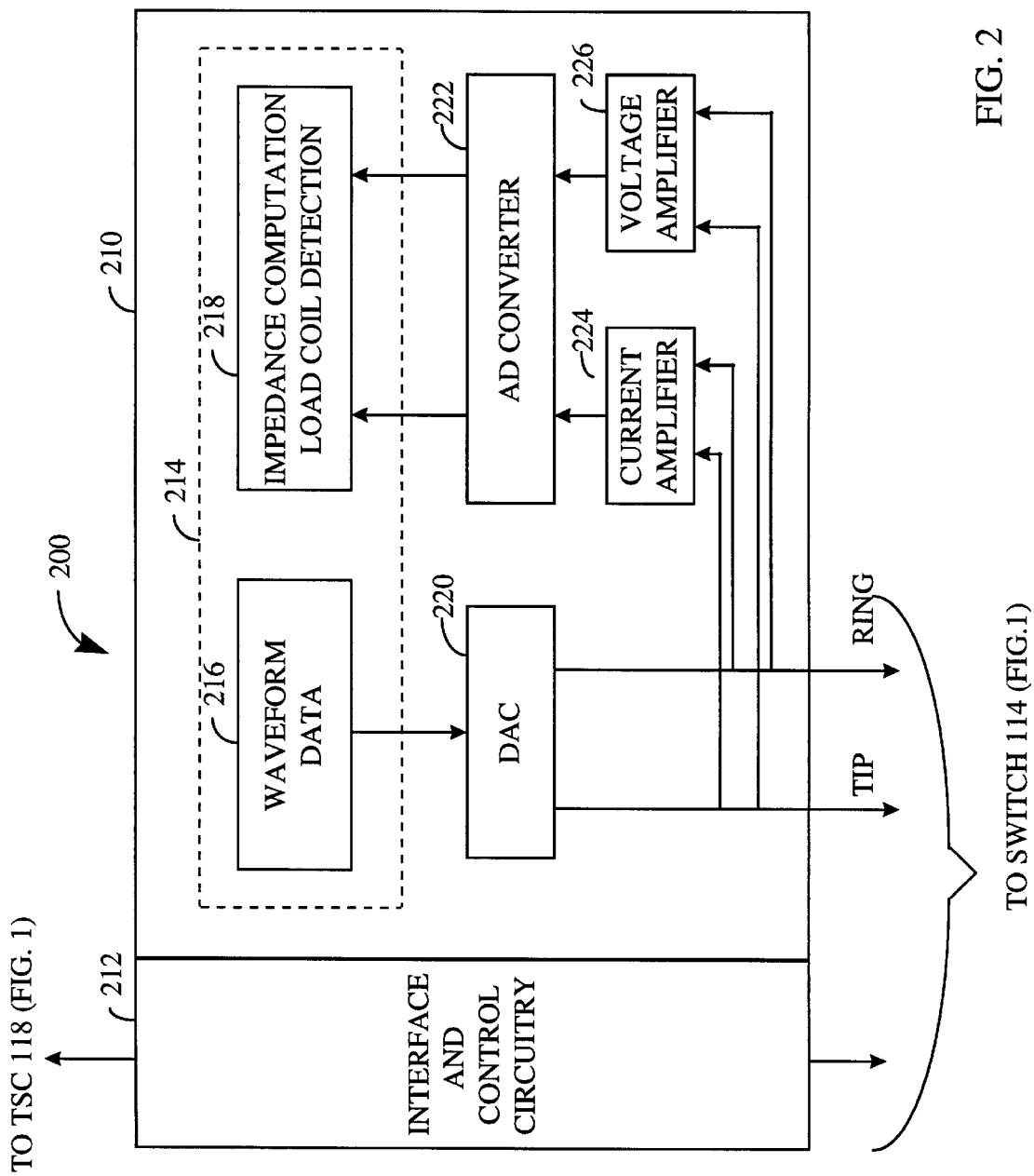
FIG. 2 is a sketch illustrating portions of a test unit attached to the telephone network of FIG. 1.

FIG. 2 shows a portion 200 of measurement unit 116. It includes interface and control circuitry 212. Interface and control circuitry 212 is as in the prior art and provides an interface to technical service center 118 as well as to switch 114.

Load coil detection circuit 210 includes microprocessor circuitry 214. Microprocessor circuitry 214 might be a general purpose microprocessor in conjunction with standard support chips, such as RAM and NVRAM, that performs other functions within measurement unit 116.

Microprocessor circuitry 214 includes waveform data 216, which is a series of digital words that represent one segment of the sampled stimulus waveform used during the test. If a stimulus waveform that is longer than that segment is required, the segment is simply repeated until the test is completed. Waveform data 216 might be stored in advance in NVRAM. Alternatively, it could be generated algorithmically based on parameters and a program stored in NVRAM. In a preferred embodiment, waveform data 216 is generated algorithmically and then stored in RAM. The algorithm for generating the data will be described in greater detail below in conjunction with FIG. 3A.

During a test, waveform data 216 is passed to Digital To Analog Converter (DAC) 220. DAC 220 converts the digital data to an analog signal, which is applied to the lines TIP and RING. Lines TIP and RING run to switch 114 (FIG. 1) and are connected to one of the subscriber loop lines 112A or 112B.

The rate at which waveform data 216 is provided to DAC 220 should be at least twice the highest frequency of the signals intended to be represented in the waveform data 216. For example, if the highest frequency component in waveform data 216 is 7 kHz, the samples should be provided to DAC 220 at a rate that is at least 14 kHz. In a preferred embodiment, though, the sample rate will be higher than twice the highest frequency.

Current amplifier 224 is also coupled to the TIP and RING lines. Current amplifier 224 provides an output that is proportional to the current flowing on the TIP and RING lines. The output of current amplifier 224 is provided to Analog To Digital Converter (ADC) 222. ADC 222 converts the current signal into digital form and passes the samples to microprocessor 214 where they can be used in the process of determining whether a load coil is present on the subscriber loop line to which the measurement unit 116 is connected. In the following description, these current measurements are denoted x(t).

ADC 222 is a dual input analog to digital converter. It can sample two signals simultaneously so that the phase relationship between the two signals is preserved. The second input to ADC 222 comes from voltage amplifier 226. Voltage amplifier 226 is likewise connected to the TIP and RING lines such that second sampled signal represents the voltage on those lines. In the following description, these voltage measurements are denoted y(t). Ideally, the two inputs should be sampled exactly simultaneously. In practice, there might be some phase delay between the samples of the inputs. This phase difference might be corrected using a calibration process as described below.

The outputs of ADC 222 are provided to impedance computation and load coil detection portions 218 of microprocessor circuitry 214. The operation of impedance computation and load coil detection circuitry 218 will be described in greater detail in conjunction with FIG. 3B below.

The sampling rate of ADC 222 should be at least twice the highest frequency in the stimulus waveform provided by DAC 220. However, in a preferred embodiment, the sampling rate is even higher, though the exact sampling rate is not critical to the invention.

The components depicted in FIG. 2 are commercially available components. For example, microprocessor circuitry 214 could include a conventional microprocessor of the type found in a general purpose computer. Alternatively, it might include the sort of microprocessor sometimes called a digital signal processor that is preprogrammed to perform certain signal processing functions.

Likewise, digital to analog converters, analog to digital converters current amplifiers and voltage amplifiers are all available commercially. In addition, it is well known that such components include support chips and other supporting components, such as clock signals and power signals, which are not shown in the figures. However, it will be appreciated that standard design practices are to be employed in making the circuitry.

THEORY OF OPERATION

Load coils are detected by using the current and voltage measurements to compute the impedance at the near end of the subscriber loop line. The current is denoted x(t) and the voltage is denoted y(t). The impedance from the near end of the line is computed.

However, in contrast to the prior art, two important advances have been made. First, the current and voltage signals are processed in the frequency domain. In the preferred embodiment, a Fast Fourier Tradnsform (FFT) algorithm is used to transfer the time domain signals into the frequency domain.

Second, the signals are modeled as random processes rather than deterministic processes. Random signal processing techniques are used that make the processing noise insensitive. As an added benefit, a measure of the reliability of the result can be computed. If the result is determined to be unreliable, the measurements can be repeated or other steps taken to verify the result without incurring the expense that would normally occur if the load status of a line is incorrectly reported.

In particular, I have recognized that, if the current x(t) is treated as an input of a system and the voltage y(t) is treated as an output of a system, then the transfer function of the system is actually the impedance. Using a deterministic model, the transfer function can be expressed in the frequency domain as $$H(jw) = \frac{Y(jw)}{X(jw)} = \frac{F[y(t)]}{F[x(t)]} = Z(jw) \quad (1)$$

The symbol F[ ] denotes that a Fourier Transform is taken.

However, rather than calculating the transfer function based on a deterministic model, the transfer function can be calculated based on the assumption that the signals x(t) and y(t) have a random component associated with them that is attributable to noise. The noise, for example, might result from noise on the line or introduced in the measurement process.

Using a random model, it is preferable to express the transfer function in terms of the auto power spectrum of the input and the cross power spectrum of the input and the output. The transfer function can be represented in the frequency domain as $$H(jw) = \frac{P_{yx}(jw)}{P_{xx}(jw)} \quad (2)$$

Here, $P_{yx}(jw)$ represents the Fourier Transform of the cross correlation between the input x(t) and the output y(t). $P_{xx}(jw)$ represents the Fourier Transform of the auto correlation of the input x(t). These functions can be expressed in an alternative fashion that is better for computation:

$$\hat{H}(jw) = \frac{\hat{P}_{yx}(jw)}{\hat{P}_{xx}(jw)} = \frac{X^*(jw)Y(jw)}{X^*(jw)X(jw)} \quad (3)$$

$\hat{P}_{yx}(jw)$ is the estimate of cross-power spectrum, $\hat{P}_{xx}(jw)$ is the estimate of the power spectrum of the input. These are called "raw estimates". A technique for improving on the estimates to make a "smooth estimate" will be described below. In the preferred embodiment, the "smooth estimate" will actually be used to compute the impedance. X(jw) and Y(jw) are the linear spectra of the input and output, respectively, and * denotes the complex conjugate.

If the spectra are computed using a Fourier Transform on sample records of length T, the numerator and denominator of Equation 3 can be rewritten as given in Equations 4 and 5.

$$\hat{P}_{xx}(jw) = \frac{2}{T} |X(w,T)|^2 \quad (4)$$

$$\hat{P}_{yx}(jw) = \frac{2}{T} X^*(w,T)Y(w,T) \quad (5)$$

These estimates, however, are statistically inconsistent; that is, the variance of the estimates does not decrease as the record length increases. In practice the random error of auto-spectrum and cross-spectrum estimates is reduced by computing an ensemble of estimates from $n_d$ different sub records, each of length T. The results are averaged to obtain final "smooth" estimates by $$\hat{P}_{xx}(w) = \frac{2}{n_d T} \sum_{i=1}^{n_d} |X_i(w,T)|^2 \quad (6)$$

$$\hat{P}_{yx}(w) = \frac{2}{n_d T \sum_{i=1}^{n_d} X_i^*(w,T)Y(w,T)} \quad (7)$$

The time T will preferably be long enough to take at least 64 samples. More preferably, 512 samples will be taken. A value for $n_d$ will range from 1 to around 64, In one embodiment, a value of at least 16 is used. However, the exact value is not critical to the invention. Also, it is not necessary that each of the sub records contain distinct samples. There could be overlap in the samples so that the total time over which samples needs to be collected is reduced. For example, the first sub record could contain samples 1 to 64. The second sub record could contain samples 50 to 114. The third subrecord would contain samples 100 to 164. The sub records would be formed in this fashion with each subrecord overlapping the last 14 samples of the previous sub record.

Thus, Equations 6 and 7 can be used to calculate the values in Equation (3). Because these values are "smooth", they are insensitive to noise. Also, because the calculation are performed in the frequency domain, values at all frequencies can be computed simultaneously, without taking separate measurements at multiple frequencies.

Further, a check can be made as to whether the calculated impedance is reliable or overly influenced by noise. To check on the reliability of the result, the coherence function is computed:

$$\gamma_{xy}^2(w) = \frac{|P_{xy}(w)|^2}{P_{xx}(w)P_{yy}(w)} \quad (8)$$

where $P_{yy}(jw)$ is the auto power spectrum of the output signal y(t). Coherence function values range between 0 and 1. A coherence value above about 0.95 indicates that noise has not unduly influenced the computation of the impedance. The coherence function is computed using the "smooth" estimates using the same ensemble averaging approach as in Equations 6 and 7.

$$\hat{\gamma}_{xy}^2(w) = \frac{|\hat{P}_{xy}(w)|^2}{\hat{P}_{xx}(w)\hat{P}_{yy}(w)} \quad (9)$$

Where $\hat{P}(jw)$'s are "smooth" estimates of spectrum density subsections.

If the coherence function indicates that the computed impedance function is reliable, there are two ways that it might be used to detect load coils. The magnitude of the impedance function might be analyzed. Alternatively, the phase of the impedance function might be analyzed.

If the magnitude of the impedance function monotonically decreases over the frequency range of interest, it is highly likely that no load coils are present. If there are spikes in the impedance function, a load coil is indicated. Each spike indicates the presence of a load coil such that the number of coils can be determined by counting the number of spikes.

A phase based method can also be used to detect the presence of load coils. The driving point impedance Z(jw) is a complex value so that it can be stated as follows:

$$Z(jw) = Z_r(w) + jZ_i(w) \quad (10)$$

where $Z_r$ and $Z_i$, denotes respective real and imaginary parts. The phase of the driving point impedance can be stated as shown below.

$$\phi_z(w) = \tan^{-1}(Z_i/Z_r) \quad (11)$$

The phases measured are sorted in ascending order according to the stimulus sinusoidal frequencies. Then the sign changes (from plus to minus or from minus to plus) of the phases are determined. If there is no sign change at all (all pluses or all minuses), no load coils are expected to be present in the subscriber's loop. Otherwise the presence of load coils is expected. The number of times the signs change indicates the number of load coils on the line.

OPERATION

Figures 3A, 3B:
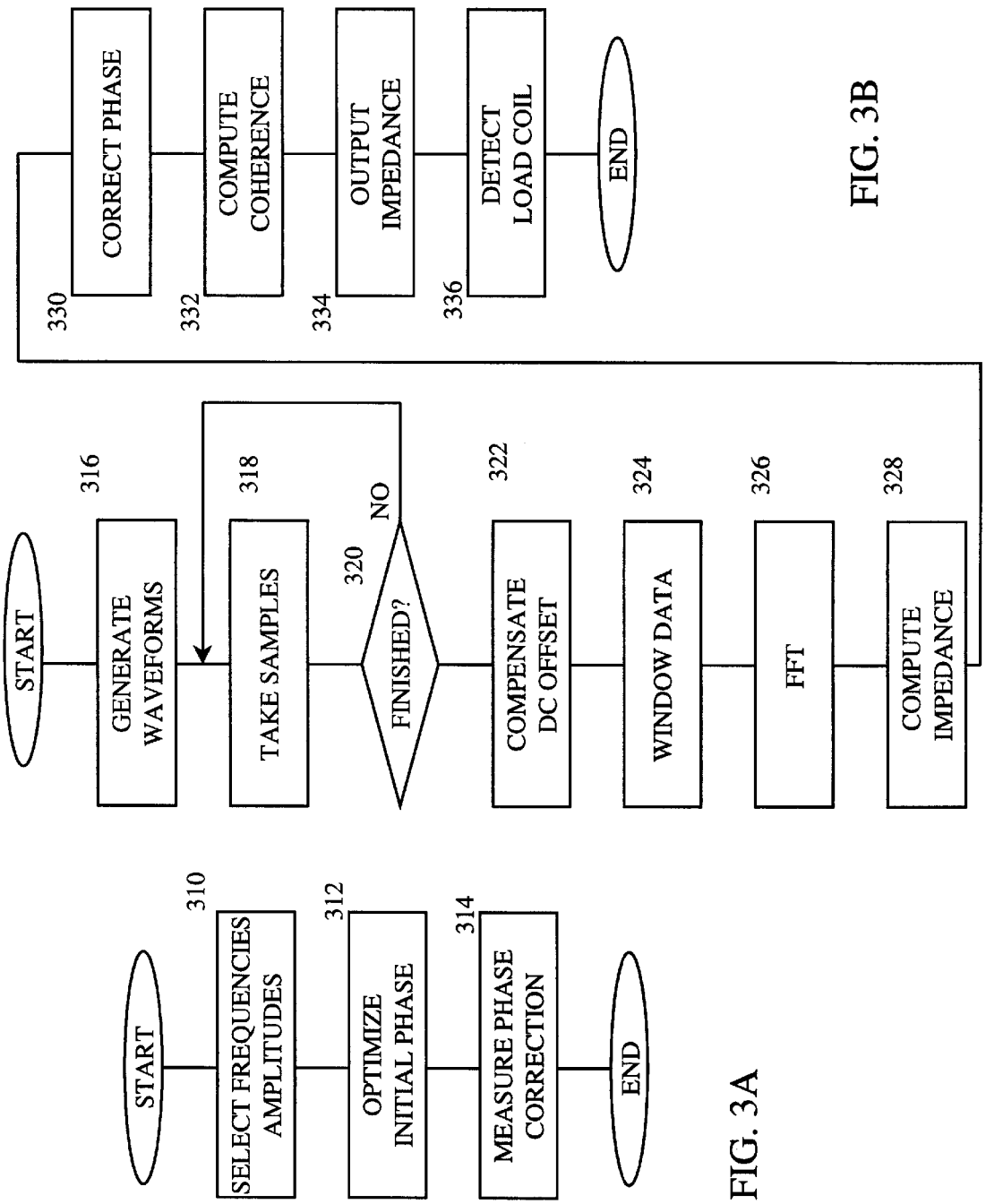
FIG. 3 is a flow chart of a process for detecting load coils.

FIG. 3A illustrates the steps that are performed in preparing a measurement unit 116 to make tests. These steps might be performed when the measurement unit is being installed or reprogrammed or might be performed when the unit is designed. In general, though, these steps would not be repeated each time a test is executed.

At step 310, frequencies and amplitudes of the stimulus waveforms are selected. The stimulus waveform is generated by summing samples of sine waves at various frequencies. The frequencies of these components in the stimulus waveform should be distributed between around 200 Hz and 7KHz. The frequencies of these waveforms are preferably selected so that only an integer number of complete cycles fit in one segment of the waveform data 216. Otherwise a proper window is required. There will preferably be components of at least twelve different frequencies selected, though any number of frequencies might be used and using a higher number of frequencies can yield more accurate load status information.

The amplitudes of each sine wave is selected to be the same. However, the amplitude is selected to ensure that the sum of all the sine waves does not exceed the input range of DAC 220. The more sine waves that are summed to make the waveform, the smaller the amplitude of each individual sine wave must be.

At step 312, the phase of the sine waves is optimized. If all of the sine waves were set to start with the same phase, they would all have peaks that would reinforce at some places in the waveform. Where all the sine waves reinforce, a large peak in the stimulus waveform would result. The amplitudes of all the sine waves would then have to be reduced to make sure that the peak did not exceed the input range of DAC 220. However, the portions of the stimulus waveform in which the sine waves were not reinforcing would then also have to be reduced. Reducing the stimulus waveform overall is undesirable because it decreases the signal to noise ratio of the measurement, leading to the possibility of more errors. Thus, to avoid the need to reduce the amplitudes of the sine waves too much, the sine waves are given different phases to reduce the magnitudes of the peaks in the stimulus waveform caused by the sine waves reinforcing.

The best phases for the sine waves used to make the stimulus waveform will depend on the frequencies of those waveforms. They might be assigned randomly. They might be assigned in an iterative process. Alternatively, the phases might be assigned deterministically in an effort to prevent any sine waves from aligning.

It should be noted that the phases assigned in step 312 might influence the maximum possible amplitude of the sine waves. Thus, the amplitude assignment at step 310 might need to be repeated or checked after the initial phases are assigned at step 312.

At step 314, a measurement is made to correct for any phase difference between the two sampling inputs ADC 222. The phase correction needed is $2\pi f t_d$ where $t_d$ is the time delay between the sampling channel and f is the frequency. This difference can be determined by connecting a resistor across the lines TIP and RING and then measuring the phase difference between the voltage and current at various frequencies. The sine waves could be generated using special waveforms programmed into waveform data 216.

For a resistor, the phase shift should be zero. Using linear regression, the measured phase shifts can be used to compute a correction factor $2\pi f t_d$ that can be later used to make an adjustment to the phases of the computed spectra.

Thus, at the end of the setup portion of the process, microprocessor circuitry 214 is programmed with a list of frequencies and initial phases that should be used to generate waveform data 216 along with an amplitude that is used for all of these frequencies. Microprocessor circuitry 214 is also programmed with a phase correction factor. This information is stored in nonvolatile memory such that the steps of FIG. 3A need not be repeated for every test session.

FIG. 3B shows the steps that are performed for each test session. At step 316, the stored list of frequencies and initial phases is used to generate waveform data 216. Microprocessor 214 uses known digital processing techniques to generates successive digital values for sine waves at each of the frequencies and with the initial phases selected at steps 310 and 312. These values for one segment of waveform data are summed and stored in RAM in microprocessor circuitry 214.

Once a segment of waveform data 216 is in RAM, the samples are retrieved and applied to DAC 220 periodically. If the end of the stored samples is reached before the end of a test, the segment stored in RAM is simply repeated.

At step 318, samples are taken using ADC 222. Samples of both the current and voltage are taken. The samples are stored in memory in microprocessor circuitry 214 for later processing.

Step 320 checks whether sufficient samples have been taken. As described above, $n_d$ sets of samples, each of length T are processed. The sets may have some overlap so that a lesser number of samples is required. However, the number of samples required can be simply computed from these parameters. If the required number of samples has not been taken, the sampling process continues.

Once sufficient samples have been taken, the process proceeds to step 322. At step 322, an adjustment is made for any DC offset error introduced in the conversion process. The offset is determined by averaging the samples in the time domain. Any non-zero value represents an offset. This offset is subtracted from all the sample values. A separate offset is computed and used for the current and voltage samples made by ADC 222.

At step 324, the time domain samples are windowed. Windowing is a known technique in digital signal processing in which the time domain samples is multiplied by another function to compensate for the fact that a finite length set of samples is being processed as if it were an infinite signal. The windowing is applied to each sub-record separately.

At step 326, a Fast Fourier Transform (FFT) is performed on each subrecord for each of the sampled signals. These calculations give the values of $X_i(w,T)$ and $Y_i(w,T)$ needed to calculate the power spectra in Equations 6 and 7.

At step 328, the power spectra are computed as in Equation 6 and 7. The impedance is then computed as in equation 3. The computed impedance is a set of complex values, one for each frequency.

At step 330, the phase of the impedance is corrected based on the phase correction measured at step 314. The phase correction is made by subtracting the appropriate phase from each computed impedance value.

At step 332, the coherence is computed. The power spectrum of the input and the cross power spectrum computed at step 328 are used. This step requires the additional computation of the power spectrum of the output signal. Once the power spectra are computed, the coherence is computed according to Equation 9. If the coherence function is below a specified threshold, the measurements might be taken again in the hopes of getting a more reliable computation. That threshold should be above 0.75. In a preferred embodiment, the threshold should be above 0.9. In the presently preferred embodiment, that threshold will be about 0.95. In the second pass, the number of sub records might be increased or other steps might be taken to minimize the effects of noise. If repeating the measurement does not increase the coherence, other problems might be indicated.

Figure 4:
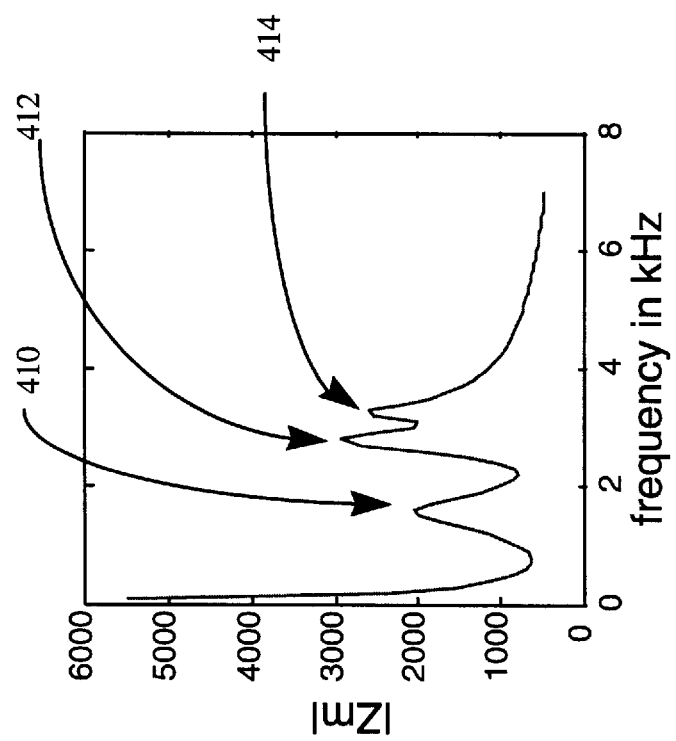
FIG. 4 is a graphical illustration of the magnitude of the impedance function computed according to the invention.

At step 334, the computed impedance is provided as an output to TSC 118. FIG. 4 is a plot depicting the magnitude of the impedance function. Providing the impedance function allows a person to analyze how many load coils are present on the line being tested. In particular, FIG. 4 shows three peaks 410, 412, and 414 in the magnitude portion of the impedance function. These peaks indicate that three load coils are present on the line being tested. Of course, the counting of peaks could be automated by a program running on microprocessor circuitry 214, which would make step 334 unnecessary. On the other hand, the information on the impedance of the line might be used for other diagnostic functions and might therefore be desirable even if not needed for load coil detection.

At step 336, a check is made whether the computed impedance values indicate the presence of load coils on the tested line. This check might be performed either in TSC 118 or within microprocessor circuitry 214. As illustrated in FIG. 4, the 410, 412 and 414 peaks in the magnitude of the impedance function each indicate a load coil on the line. However, load coils might also be detected by analyzing the phase of the impedance function. Equation 11 defines how the phase of the impedance may be determined. Changes in the sign of the phase indicate a load coil.

Load coils might be detected by analyzing either the phase or the magnitude of the impedance function. For greater confidence in the result, both the magnitude and the phase portions of the impedance function could be analyzed. The results from both should be consistent. If they are not, the measurements might be repeated. Alternatively, inconsistency between the phase and frequency determinations of load coils might signal a problem elsewhere on the line or with the measurement equipment that would require the intervention of a technician. Once one subscriber loop is tested, further subscriber loops can be tested. To test another line, commands are sent to switch 114 to connect the next line to the TIP and RING lines from measurement unit 116. Then, the process of FIG. 3B picks up at step 318. The process can be repeated until all desired lines are tested. The same waveform data can be used for all tests.

Having described one embodiment, numerous alternative embodiments or variations might be made. For example, current amplifiers 224 and voltage amplifier 226 are optional components.

A dual input ADC circuit is shown. Separate analog to digital converters could be used, though it is preferable that the two analog to digital converters be synchronized.

It was described that samples were stored and then processed. It will be appreciated that some digital signal processing hardware can process samples as they are being taken and the need to store the samples might be eliminated. Alternatively, the samples might be processed in a pipelined fashion such that processing starts once a portion of the data is collected.

Also, FIG. 2 shows the portion of measurement unit 116 that is used for load coil detection. In a preferred embodiment, measurement unit 116 contains test and measurement hardware and software to perform many other test functions. In fact, it is contemplated that the components shown in FIG. 2 will be used for other diagnostic functions, such as checking for short circuits or breaks in the lines. Line characterization is a function that is performed when a technician enters a command at technical service center 118. In this way, line characterization can be achieved at a very low cost because it employs test equipment that would otherwise be present in a telephone network.

Of course, it is not necessary that the hardware and software needed for line characterization be incorporated into an existing test unit. It could alternatively be implemented as a separate test device that might be connected to telephone lines only when needed to characterize the line.

Moreover, it was described that spectra were computed using the FFT. While the FFT is a widely used frequency transform technique, other frequency transform techniques might be used.

In addition, it was described that the computations are designed to measure the impedance of the line. It will be appreciated that the admittance is the reciprocal of the impedance and provides the same information in a different format such that either admittance or impedance might be used interchangeably.

Also, it was described that the invention is used for characterizing subscriber loop lines. It could be used for checking for load coils on other types of lines. It also might be useful for measuring impedance for purposes other than checking for load coils.

Therefore, the invention should be limited only by the spirit and scope of the appended claims.

What is claimed is:

1. A method of analyzing a line, comprising the steps of:
    a) applying a signal to the line, the signal having a plurality of frequency components;
    b) sampling the current and the voltage on the line;
    c) computing at least a cross power spectra and a power spectra from the current and voltage measurements;
    d) using the computed cross power and power spectra to compute the impedance of the line; and
    e) analyzing the computed impedance to characterize the line.

2. The method of claim 1 wherein the step of computing a cross power spectra comprises:
    a) forming a plurality of subrecords from the samples;
    b) performing a frequency transform on each subrecord; and
    c) averaging the subrecords.

3. The method of claim 1 additionally comprising the steps of:
    a) computing a coherence function indicating the impact of noise on the computed impedance;
    b) indicating the computed impedance is not reliable for characterizing the line when the coherence function is below a predetermined threshold.

* * * * *